(12) United States Patent
Signer et al.

(10) Patent No.: US 10,784,065 B2
(45) Date of Patent: Sep. 22, 2020

(54) ACTIVATABLE THERMAL FUSE

(71) Applicant: SCHURTER AG, Lucerne (CH)

(72) Inventors: Guido Signer, Neuenkirch (CH); Peter Straub, Oberwil/Zug (CH); Benjamin Schibli, Olten (CH)

(73) Assignee: SCHURTER AG, Lucerne (CH)

( * ) Notice: Subject to any disclaimer, the term of this patent is extended or adjusted under 35 U.S.C. 154(b) by 0 days.

(21) Appl. No.: 16/069,097

(22) PCT Filed: May 27, 2016

(86) PCT No.: PCT/EP2016/062038
§ 371 (c)(1),
(2) Date: Jul. 10, 2018

(87) PCT Pub. No.: WO2017/121498
PCT Pub. Date: Jul. 20, 2017

(65) Prior Publication Data
US 2019/0019641 A1 Jan. 17, 2019

(30) Foreign Application Priority Data
Jan. 14, 2016 (WO) ............... PCT/EP2016/050596

(51) Int. Cl.
*H01H 37/70* (2006.01)
*H01H 85/10* (2006.01)
(Continued)

(52) U.S. Cl.
CPC ............ *H01H 37/70* (2013.01); *H01H 85/10* (2013.01); *H01H 85/36* (2013.01); *H05K 1/0201* (2013.01);
(Continued)

(58) Field of Classification Search
CPC ........ H01H 37/70; H01H 85/36; H01H 85/10; H01H 2037/762; H01H 2037/046; H05K 1/0201
(Continued)

(56) References Cited

U.S. PATENT DOCUMENTS 4,145,654 A * 3/1979 Grimm ............... H01H 37/766
337/403
4,186,366 A * 1/1980 McVey ............... H01H 37/766
337/407
(Continued)

FOREIGN PATENT DOCUMENTS

DE 103 11 090 A1 9/2003
JP S61177341 U 11/1986
(Continued)

OTHER PUBLICATIONS

International Search Report and Written Opinion dated Oct. 5, 2016 in PCT/EP2016/062038 (15 pages).

*Primary Examiner* — Jayprakash N Gandhi
*Assistant Examiner* — Stephen S Sul
(74) *Attorney, Agent, or Firm* — Rothwell, Figg, Ernst & Manbeck, P.C.

(57) ABSTRACT

An activatable thermal fuse includes a first electrical terminal, a second electrical terminal, and an electrically conductive bridge element having a first electric contact with the first electrical terminal and a second electric contact with the second electrical terminal. At least a part of the bridge element is displaceable from a first position in which the first contact is established to a second position in which the first contact is opened, and a thermally sensitive member releases the part when exposed to a predetermined temperature value. An activating element blocks displacement of the part from the first position, in a first position of the activating element, and enables the displacement of the part in a second position
(Continued)

of the activating element. A method of manufacturing a printed circuit board, a method of monitoring, and an electronic circuit including the thermal fuse are also provided.

27 Claims, 7 Drawing Sheets

(51) Int. Cl.
    *H01H 85/36*     (2006.01)
    *H05K 1/02*     (2006.01)
    *H01H 37/04*     (2006.01)
    *H01H 37/76*     (2006.01)

(52) U.S. Cl.
    CPC . *H01H 2037/046* (2013.01); *H01H 2037/762* (2013.01)

(58) Field of Classification Search
    USPC .................................. 337/148, 195, 342, 407
    See application file for complete search history.

(56) References Cited

U.S. PATENT DOCUMENTS

| | | | |
|---|---|---|---|
| 4,292,617 A * | 9/1981 | McVey | H01H 37/765 337/407 |
| 5,280,262 A | 1/1994 | Fischer | |
| 5,568,350 A * | 10/1996 | Brown | H02H 3/046 361/104 |
| 6,445,277 B1 * | 9/2002 | Ishikawa | H01C 7/12 337/290 |
| 6,734,781 B1 * | 5/2004 | Nagashima | H01H 37/761 337/159 |
| 9,431,203 B2 * | 8/2016 | Doblack | H01H 85/36 |
| 9,472,364 B2 | 10/2016 | Matthiesen et al. | |
| 9,620,321 B2 * | 4/2017 | Storzinger | H01H 37/761 |
| 2008/0194152 A1 * | 8/2008 | Roset | H01R 11/281 439/754 |
| 2009/0302991 A1 | 12/2009 | Neilly et al. | |
| 2011/0050386 A1 * | 3/2011 | Schlenker | H01H 37/761 337/407 |
| 2011/0096448 A1 * | 4/2011 | Wortberg | H01H 9/106 361/62 |
| 2011/0211284 A1 * | 9/2011 | Yoneda | H01H 83/20 361/55 |
| 2012/0134155 A1 * | 5/2012 | Wendt | F21S 2/00 362/249.03 |
| 2013/0033355 A1 * | 2/2013 | Meyer | H01H 37/761 337/147 |
| 2013/0249401 A1 * | 9/2013 | Kato | F21V 25/10 315/112 |
| 2015/0318131 A1 * | 11/2015 | Matthiesen | H01H 37/70 337/407 |
| 2015/0340181 A1 | 11/2015 | Ho et al. | |
| 2016/0032885 A1 * | 2/2016 | Vogelbacher | F02P 19/027 361/104 |
| 2017/0040136 A1 | 2/2017 | Straub et al. | |

FOREIGN PATENT DOCUMENTS

| | | |
|---|---|---|
| JP | 2001307617 A | 11/2001 |
| JP | 2002529904 A | 9/2002 |
| JP | 2012018789 A | 1/2012 |
| JP | 2017515293 A | 6/2017 |
| WO | 2010/110877 A1 | 9/2010 |
| WO | 2015/096853 A1 | 7/2015 |

\* cited by examiner

ACTIVATABLE THERMAL FUSE

CROSS REFERENCE TO RELATED APPLICATIONS

This application is a 35 U.S.C. 371 National Phase Entry Application from PCT/EP2016/062038, filed May 27, 2016, which claims priority to European Patent Application No. PCT/EP2016/050596, filed Jan. 14, 2016, the disclosures of which are incorporated herein in their entirety by reference, and priority is claimed to each of the foregoing.

The invention addressed herein relates to an activatable thermal fuse. Under further aspects, the invention relates to a method of manufacturing a printed circuit board with an activatable thermal fuse, a method of monitoring an activatable thermal fuse and to an electronical circuit comprising an activatable thermal fuse.

A thermal fuse is an electric safety device that breaks an electrical circuit when a predetermined thermal overload condition occurs. Compared to a current-limiting fuse, which is triggered by the current flowing through it, a thermal fuse primarily reacts on the temperature. In several applications, e.g. automotive, heating or air conditioning applications, protective devices are needed that interrupt a current circuit, if the temperature at the device exceeds a given limit. This way subsequent damage after a failure of e.g. a high power semiconductor element is prevented. In contrast to a thermal switch, a thermal fuse will keep the current circuit interrupted even after the temperature has dropped below the limit again. A typical temperature limit is 200° C. Above this limit there is often the danger of damaging the base material of printed circuit boards, desoldering of components and even of the occurrence of fire.

A common and very efficient way of assembling electronic devices comprises the steps of placing surface mountable components on a printed circuit board by a pick-and-place robot and a reflow soldering step to establish the electrical contacts. Commonly used soldering temperatures for reflow soldering are in the range of 240° C. to 265° C. for a period of 30 to 60 seconds (JEDEC norm). Common thermal fuses with limit temperatures below 240° C. can therefore not be mounted during an assembly process involving reflow soldering, as such thermal fuse may not be just reset after having overload-reacted. Manual placing followed by a special soldering procedure is necessary in those cases. This leads to expensive and error-prone additional steps in the production.

From the document WO 2015 096 853 A1 a thermal fuse in SMD (surface-mounted device) mounting form is known that can be reflow soldered. The fuse is triggered by a combination of temperature and current flowing through the fuse. As the thermal fuse is current free during the reflow soldering process, it is not triggered during soldering. Due to its temperature-current characteristic curve it may not be suitable for all applications.

From the document WO 2010 110 877 A1 a reflowable thermal fuse is known. After soldering such a thermal fuse it needs to be activated. Through additional electrical contacts a high current is sent through a subsidiary fuse wire that melts in this activation step. Before the activation step is carried out the subsidiary fuse wire prevents the triggering of the thermal fuse. However, the additional electrical contact occupies space and a conductor path needs to be provided on the circuit board only for the activation step. A current source must be available, too.

The object of the present invention is to provide an alternative thermal fuse.

This object is achieved by an activatable thermal fuse according to claim 1.

The activatable thermal fuse according to the present invention comprises a first and a second electrical terminal and an electrically conductive bridge element. The bridge element is in a first electric contact with the first terminal and it is in a second electric contact with the second terminal. This way, an electrically conductive path from the first terminal to the second terminal is provided.

At least a part of the bridge element is displaceable from a first position in which the first contact is established to a second position in which the first contact is opened. When the part of the bridge element is in the second position, the electrically conductive path between the terminals is interrupted. This corresponds to the state of the fuse after it has been triggered by thermal overload.

The activatable thermal fuse further comprises a thermally sensitive member holding the addressed part in the first position and releasing the part as soon as the thermally sensitive member is exposed to a predetermined temperature value.

The activatable thermal fuse further comprises a biasing member biasing the part towards the second position, i.e. "triggered" position.

The activatable thermal fuse further comprises a mechanically displaceable activating element blocking displaceability of the part in the first position in a first position of the activating element and enabling the displaceability of the part in a second position of the activating element.

The biasing member assures that once the thermal fuse is triggered the part of the bridge element is displaced to its second position and the current path is interrupted. Nevertheless, this is only possible if the part is neither held in its first position by the thermally sensitive member nor the displaceability of the part is blocked by the activation member. The thermally sensitive member may release the part of the bridge element for example by opening an interlocking connection to the bridge element or by melting a metallurgically bonded connection.

The blocking of the displaceability of the part of the bridge element may for example be established by direct mechanical contact between the activating element and the part or it may be established e.g. by indirectly acting on the part, for example by blocking a deformation or movement of the thermally sensitive member or by counteracting the biasing of the biasing member.

The activatable thermal fuse according to the present invention therefore has a disabled or secured state, in which the thermal fuse will not be triggered even if the predefined temperature value is reached or exceeded. In this state it can undergo a reflow soldering process without being triggered. This disabled state is defined by the activating element set in its first position. The thermal fuse has an enabled or activated state, in which the thermal fuse is triggered by exceeding the predefined temperature value. This enabled state is defined by the activating element being in its second position.

The thermal fuse according to the present invention has the advantage that it can be mounted by reflow soldering and is easy to activate.

The activatable thermal fuse according to the invention is brought into the activated state by purely mechanically moved means.

The activatable thermal fuse according to the invention in the disabled state is allowed to undergo processes that require a temperature that otherwise would trigger the thermal fuse. E.g. reflow soldering may be such a process.

In one embodiment of the activatable thermal fuse according to the invention, which may be combined with any of the embodiments still to be addressed unless in contradiction, the thermal fuse comprises a guiding element defining a path of movement of the activating element. Such path of movement may be at least one of a translation, a rotation, a screw movement.

The advantage of this embodiment is that the mechanical activation of the fuse is easily performed for example by using a gripper or a screw driver.

In one embodiment of the activatable thermal fuse according to the invention, which may be combined with any of the preaddressed embodiments and with any of the embodiments still to be addressed unless in contradiction, the thermal fuse comprises a snapping mechanism preventing returning of the activating element from the second position of the activating element to the first position of the activating element.

With this embodiment an erroneous disabling of a previously activated thermal fuse is prevented.

In one embodiment of the activatable thermal fuse according to the invention, which may be combined with any of the preaddressed embodiments and with any of the embodiments still to be addressed unless in contradiction, the predetermined temperature value is in the range up to 240° C., preferably in the range from 150° C. to 240° C., both limits included.

A predetermined temperature value in the range from 150° C. to 240° C. is particularly useful. This temperature range is selected below the temperature region where there is the danger of destruction of an electronical circuit e.g. due to desoldering of components that have been soldered in a typical soldering process. The activatable thermal fuse according to this embodiment in the disabled state survives a typical soldering process without being triggered prematurely and is acting as protective device as soon as it is activated.

In one embodiment of the activatable thermal fuse according to the invention, which may be combined with any of the preaddressed embodiments and with any of the embodiments still to be addressed unless in contradiction, the thermally sensitive member comprises a solder.

In this embodiment, the releasing of the part of the bridge element occurs when the solder melts. By selecting an appropriate solder having a melting point below or at the predetermined temperature value a precisely defined triggering temperature can be achieved.

In one embodiment of the activatable thermal fuse according to the invention, which may be combined with any of the preaddressed embodiments and with any of the embodiments still to be addressed unless in contradiction, the thermally sensitive member comprises a bimetal strip or a bimetal disc.

A reliable temperature dependent releasing mechanism can be built using bimetal. In particular bimetal discs can be formed such that they quickly snap from one curvature state to another state in a well-defined narrow temperature range.

In one embodiment of the activatable thermal fuse according to the invention, which may be combined with any of the preaddressed embodiments and with any of the embodiments still to be addressed unless in contradiction, the thermally sensitive member comprises a shape memory alloy.

Shape memory alloys allow to create mechanical elements that change their form significantly at their transformation temperature. This is advantageous to achieve a highly reliable mechanical release mechanism.

In one embodiment of the activatable thermal fuse according to the invention, which may be combined with any of the preaddressed embodiments and with any of the embodiments still to be addressed unless in contradiction, the thermal fuse comprises a housing having a bottom side on which the first and second electrical terminal are arranged.

The first and second electrical terminals may be solder connections suitable for surface mounting. This embodiment allowing surface mounting of the thermal fuse is advantageous, because the positioning of devices by surface mounting is very precise. Therefore, the effect of an overheating device on the temperature of the thermal fuse in its proximity is well predictable and reproducible. The housing e.g. consists of a plastic material resisting a temperature of 260° C., which makes it suitable for a reflow process. A typical size of the housing can e.g. be 10 mm×12 mm seen in top view.

In one embodiment of the activatable thermal fuse according to the invention, which may be combined with any of the preaddressed embodiments and with any of the embodiments still to be addressed unless in contradiction, the activating element is integrated into the housing, in particular designed as one piece with the housing, and is accessible from a top side and/or from a bottom side and/or from a lateral side of the housing.

In this embodiment it is still easy to mechanically activate the thermal fuse after it has been soldered to a printed circuit board. An embodiment providing accessibility of the activating element from the bottom side may be used in combination with a printed circuit board having a hole or a slit in the region where the thermal fuse is to be placed, such that the activating element is operable through the printed circuit board.

In one embodiment of the activatable thermal fuse according to the invention, which may be combined with any of the preaddressed embodiments and with any of the embodiments still to be addressed unless in contradiction, the position of the activating element is visible from a top side of the housing.

In this embodiment the position of the activating element shows the status of activation in a way that can be seen by a human or that can be detected by optical means. With this embodiment, it can quickly be verified that all thermal fuses on a print are activated. This embodiment is particularly well suited for automatic visual process control performed by acquisition of a digital image and subsequent image analysis.

In one embodiment of the activatable thermal fuse according to the invention, which may be combined with any of the preaddressed embodiments and with any of the embodiments still to be addressed unless in contradiction, the biasing member is a compressed, stretched, bended or twisted elastic element.

In one embodiment of the activatable thermal fuse according to the invention, which may be combined with any of the preaddressed embodiments and with any of the embodiments still to be addressed unless in contradiction, the biasing member comprises an elastic section of the bridge element.

In this embodiment the elastic section of the bridge element provides or at least contributes to a biasing force between the displaceable part of the bridge element and the remainder of the bridge element.

In one embodiment of the activatable thermal fuse according to the invention, which may be combined with any of the preaddressed embodiments and with any of the embodiments still to be addressed unless in contradiction, the biasing member has the form of a coil spring, a spiral spring or a leaf spring.

In one embodiment of the activatable thermal fuse according to the invention, which may be combined with any of the preaddressed embodiments and with any of the embodiments still to be addressed unless in contradiction, in the second position of the part of the bridge element the first and the second contact are open, wherein preferably said bridge element is a substantially rigid element.

This embodiment allows simple symmetric constructions. The first and the second terminal are interchangeable in this case.

In one embodiment of the activatable thermal fuse according to the invention, which may be combined with any of the preaddressed embodiments and with any of the embodiments still to be addressed unless in contradiction, the thermal fuse is adapted to carry electrical current higher than 5 Ampère, preferably higher than 30 Ampère and up to 100 Ampère.

This embodiment adapted to high current applications can e.g. have a bridge element having a large conductive cross section leading to low voltage drop and low power dissipation in the thermal fuse.

In one embodiment of the activatable thermal fuse according to the invention, which may be combined with any of the preaddressed embodiments and with any of the embodiments still to be addressed unless in contradiction, a current-limiting fuse element is arranged in a conducting path between said first and said second electrical terminal.

This embodiment adds a current-limiting functionality to the thermal fuse. With this embodiment, an activatable thermal fuse is provided that has the characteristics of a melting fuse for temperatures below the predetermined temperature value. Over-current can trigger the fuse, even if the predetermined temperature value is not exceeded. In this embodiment, e.g. the bridge element comprises a current-limiting fuse element.

In one embodiment of the activatable thermal fuse according to the invention, which may be combined with any of the preaddressed embodiments and with any of the embodiments still to be addressed unless in contradiction, the current-limiting fuse element is formed as constriction in a conducting path, in particular as constriction in a conducting path on an electrically isolating substrate.

This embodiment is a very simple and cost efficient way to implement a current-limiting fuse element. This type of current-limiting fuse element may be implemented on the bridge element. The constriction in a conducting path can e.g. be formed as a constriction in a wire or as a constriction in a printed circuit board track on an electrically isolating substrate. Over-current through a narrow section of the conducting path melts this section and interrupts the electrical connection between the terminals of the fuse.

In one embodiment of the activatable thermal fuse according to the invention, which may be combined with any of the preaddressed embodiments and with any of the embodiments still to be addressed unless in contradiction, at least the bridge element comprises an alloy having a temperature coefficient of resistance, the absolute value of the temperature coefficient of resistance being below 500 parts per million per Kelvin at room temperature.

This embodiment is particularly useful, if the activatable thermal fuse is intended for use in a method of monitoring the current flowing through the thermal fuse. With this embodiment, the resistance between the terminals of the fuse does not change significantly with changing temperature. Compared to normal metals used as electrical conductors, such as copper, which typically have a temperature coefficient of resistance in the order of magnitude of 5000 ppm/K, a reduction of the temperature dependency by a factor of 10 is achieved with this embodiment. A voltage measured between the terminals can therefore be interpreted as indicator for the current by applying Ohm's law and largely ignoring temperature influence. Possible alloys that have a temperature coefficient α of resistance (TCR) that fulfill the condition $|\alpha| \le 500$ ppm/K at room temperature, are for example:

an alloy of 75-76% Cu, 23% Ni, 1-2% Mn (known as ISA-ZIN), an alloy of 89% Cu, 9% Ni, 2% Sn (known as CW351H), an allow of 85% Cu, 15% Ni, 0.3% Mn (known as "Legierung 127").

These alloys are cost-efficient and suitable for electro technical applications. The first and second terminal may comprise an alloy that fulfills this condition, too.

Alloys fulfilling an even stronger condition of $|\alpha| \le 50$ ppm/K at room temperature, such that the temperature dependency as compared to copper is reduced by a factor of 100, are for example:

an alloy of 60% Cu, 40% Ni (known as Constantan), an alloy of 84% Cu, 12% Mn, 4% Ni (known as Manganin) or an alloy of 84% Cu, 13% Mn, 3% Al (known as Isabellin).

For high precision measurements an alloy of 90.7% Cu, 7% Mn and 2.3% Sn (known as ZERANIN 30) fulfilling a condition $|\alpha| \le 3$ ppm/K at room temperature is commercially available.

To achieve very low temperature dependence of the resistance of the thermal fuse, the complete current conducting path including both terminals are made of an alloy fulfilling one of the above conditions. An alloy may be selected that fulfills one of the above conditions in a large temperature range, in particular in the whole range between room temperature and the predetermined temperature value at which the thermal fuse is triggered.

In one embodiment of the activatable thermal fuse according to the invention, which may be combined with any of the preaddressed embodiments and with any of the embodiments still to be addressed unless in contradiction, the activatable thermal fuse has further electrical terminals in addition to the first and the second electrical terminal.

This embodiment allows for example to electrically contact the current conducting path through the thermal fuse at intermediate points between the first and second electrical terminal. Additional terminals may also provide electrical contact to other elements in the housing of the thermal fuse, in particular to sensor elements used for monitoring the state of the fuse.

The invention is further directed to a method of manufacturing a printed circuit board according to claim 19.

This method of manufacturing a printed circuit board with an activatable thermal fuse according to the present invention and possibly one or more than one of its addressed embodiments, comprises the steps of covering conductive soldering pads of the printed circuit board with a solder, positioning the first and second electrical terminal of the thermal fuse on conductive soldering pads covered with said solder, ensuring that the activating element of the thermal fuse is in the first position of the activating element, heating the printed circuit board to a temperature above the melting point of the solder, cooling down the printed circuit board below the melting point of the solder, moving the activation element of the thermal fuse into the second position of the activation element.

The moving of the activation element is performed by applying a force or a torque to the activation element.

The invention is further directed to an electronical circuit.

Such an electronical circuit comprises an activatable thermal fuse according to the present invention being connected in series to a current conducting path of a high power semiconductor device.

In an embodiment of the electronical circuit the activatable thermal fuse and the high power semiconductor device are arranged in a common housing.

This embodiment has the advantage that the temperature of thermal fuse is close to the temperature of the high power semiconductor. Furthermore, in practical use the combination of high power semiconductor devices often may occur in pairs, therefore prepackaging them in a common housing leads to more efficient assembly processes.

The invention is further directed to a method of monitoring the state of an activatable thermal fuse.

This method is a method of monitoring the state of an activatable thermal fuse according to the present invention or an electronical circuit according to the present invention, the state including a triggering state and/or a current and/or a temperature, wherein a voltage between two electrical terminals of said activatable thermal fuse is measured.

This method uses the activatable thermal fuse as sensor. The state of the activatable thermal fuse may be characterized by the fact that is has been triggered or not triggered, respectively. The state may be characterized by the current flowing through it or by the temperature of the thermal fuse. The measurement of the voltage may be performed between any two of the terminals, including the first and second electrical terminal, as well as one or two of the additional terminals, in case additional terminals are present in the embodiment at hand. For the measurement of the voltage, a voltmeter having high input resistance may be used. For use with this method, specifically adapted elements may be present in the activatable thermal fuse, such as a resistor element of predefined resistance, an element of predefined temperature dependence of the resistance or a thermocouple element.

In an embodiment of the method a voltage between the first and the second electrical terminal is measured and a current flowing through the activatable thermal fuse is determined from the voltage measured in the last step and a predetermined resistance value of the activatable thermal fuse.

In this embodiment, the activatable thermal fuse is used as a measuring resistor. Monitoring a current for example through a high power semiconductor device that needs thermal protection by a thermal fuse may be done in very simple way with this embodiment of the method, without needing an additional shunt resistor or the like, thus leading to a compact design of the circuitry. For use with this embodiment of the method, the activatable thermal fuse may be designed to have a predetermined resistance such as 500 µΩ or 1 mΩ. This way, the resistance is low enough that not too much power is dissipated, but high enough to allow a precise measurement of the current flowing through the fuse. The predetermined resistance includes the contribution of the electrical terminals to the resistance. For this embodiment of the method, it is particularly useful to make use of an activatable thermal fuse that applies an alloy having low temperature coefficient of resistivity in its current conducting path. This way, a measurement error due to a temperature dependence of the resistance is kept small.

The Activatable thermal fuse according to the invention may e.g. be applied for safeguarding a transistor in a high power application, such as in automotive, heating or ventilation, as well as in renewable energy applications.

For a lot of applications, transistors are operated in pulsed mode. The maximum allowable thermal load is not exceeded during pulsed operation. However, if in case of a failure the transistor is driven by a DC signal or if the transistor is damaged, a current may flow, that lies below the current limit that triggers a standard fuse, but is high enough to heat the transistor to dangerously high temperatures. In particular a so-called resistive failure of a transistor may lead to such a situation. A hot transistor may then lead to subsequent damage in its surrounding or may even cause a fire. To prevent subsequent damage, an activatable thermal fuse according to the invention can be placed in proximity of, i.e. thermally coupled to, the high power transistor and can be connected in series with the current path through the high power transistor. When the temperature limit is exceeded, the thermal fuse interrupts the current path and prevents further heating.

The invention shall now be further exemplified with the help of figures. The figures show:

FIG. 1.$a$) to FIG. 1.$d$) a schematic view of the activatable thermal fuse according to the invention in four different states;

FIG. 2.$a$) to FIG. 2.$d$) a cross-section through an embodiment of the activatable thermal fuse on a printed circuit board in four different states.

FIG. 3.$a$) to FIG. 3.$d$) a schematic view of a further embodiment of the activatable thermal fuse in four different states.

FIG. 4.$a$) a perspective view of an electronical circuit with an activatable thermal fuse;

FIG. 4.$b$) the perspective view of FIG. 4.$b$) with surface temperature indicated by gray levels.

Figure 1:
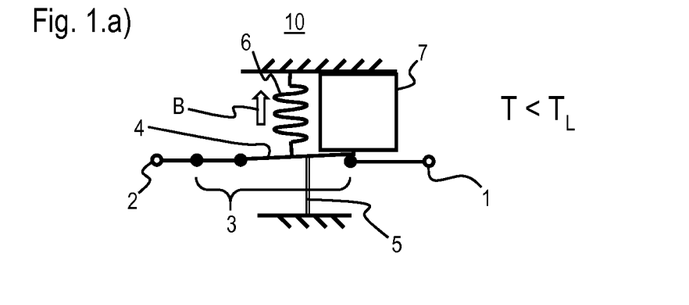

FIG. 1 shows schematically and simplified, the activatable thermal fuse according to the invention in four different states.

FIG. 1.$a$) shows the activatable thermal fuse in the disabled state. The temperature T of the fuse lies below the predetermined temperature value $T_L$, which is characteristic for the thermal fuse. $T_L$ could for example be 200° C. An electrical connection is established from a first terminal 1 over an electrically conductive bridge element 3 to a second terminal 2. A part 4 of the bridge element is in a first position, such that the electrical contact to the first terminal 1 is established. A thermally sensitive member 5 holds the part 4 of the bridge element in the first position. A biasing member 6, here symbolically pictured as stretched coil spring, is biasing the part 4 in the direction B indicated by the arrow. An activating element 7 blocks the displaceability of the part 4 of the bridge element.

FIG. 1.b) shows the activatable thermal fuse still in the disabled state, but the temperature T of the fuse now lies above the predetermined temperature value $T_L$. The thermally sensitive element 5 releases the part 4. This releasing is indicated by dashed lines. However, the part 4 is not displaced into its second position, because the activating element 7 is blocking the displaceability. The high temperature may occur because the first and second terminal 1, 2 are connected to leads 14, 15 shown on the left and the right by a reflow soldering process.

FIG. 1.c) shows the activatable thermal fuse in its activated state and operated at a temperature T below $T_L$. By the application of an activating action in direction A indicated by an arrow, the activating element has been moved to the second position of the activating element. Only the thermally sensitive member 5 holds the part 4 of the bridge element in its first position.

FIG. 1.d) shows the activatable thermal fuse in its activated state and at a temperature T above $T_L$. The thermally sensitive member 5 has released the part 4. The part 4 has been displaced into its second position under the biasing effect of the biasing member 6. Thereby, the electrical contact between the part 4 of the bridge element 3 and the first terminal has been opened. The biasing member here is symbolically pictured as contracted coil spring.

Figure 2:
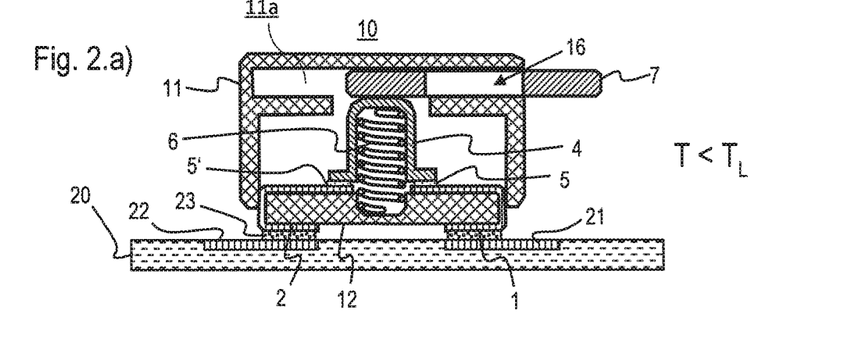

FIG. 2 shows a cross-section through an embodiment of the activatable thermal fuse and through a part of a printed circuit board.

FIG. 2.a) to 2.c) illustrate steps of the method of manufacturing a printed circuit board with an activatable thermal fuse. FIG. 2.d) shows the state of the same thermal fuse after it was triggered.

FIG. 2.a) shows the embodiment of the thermal fuse in the disabled state. The temperature T of the fuse lies below the predetermined temperature value $T_L$. First and second terminals 1, 2 are arranged below a base plate 12. The displaceable part 4 of the bridge element has the form of a hat. It could e.g. be produced by deep-drawing a copper plate. The thermally sensitive member 5 constructed as soldering point, at which the bridge element is soldered to an electrical connection leading to the first terminal 1. A further thermally sensitive member 5' is formed as a similar soldering point and establishes the electrical connection from the part 4 of the bridge element to the second terminal 2. The solder used for the thermally sensitive elements has a melting point at temperature $T_L$, the predetermined temperature value. A compressed coil spring sits in the hat form of the bridge element and exerts an upward directed biasing force onto the displaceable part 4 of the bridge element. A housing 11 encloses the thermal fuse. The housing e.g. consists of a plastic material resisting a temperature of 260° C., which makes it suitable for a reflow process. In the inside of the housing a guiding element 11a for the activating element 7 is formed, that allows a horizontal translation of the activating element. The activating element is in its first position and blocks the displaceability, in this case an upward movement, of the part 4. The activating element has a through hole 16 in a middle part. The activating element protrudes out of right side of the housing. This way, it is clearly visible from outside, particularly from above, that the thermal fuse is in the disabled state. The thermal fuse is positioned on a printed circuit board 20. Soldering pads 21, 22 are covered with solder 23. The first and second terminals 1, 2 are each placed on top of one of the soldering pads.

FIG. 2.b) shows the embodiment of the thermal fuse still in the disabled state. The thermal fuse is heated up to a temperature above the melting point of the solder 23. The temperature T of the fuse now lies above the predetermined temperature value $T_L$. Although the thermally sensitive member 5 melts at this temperature and loses its ability to hold the part 4 in place, the part 4 is blocked by the activating element 7 and does not move.

FIG. 2.c) shows the thermal fuse after being cooled down to a temperature T below $T_L$. A soldering contact between soldering pads 21, 22 and the first and second terminal 1, 2 is established. The thermally sensitive member 5 is solid again and has regained its ability to hold part 4 in place. By an activating action in direction A the activating element has been moved into the second position of the activating element. Such an activating action consisting in pushing the protruding part of the activating element 7 into the housing 11 may be performed by a gripper that is as well used for pick and place activity. Now, the hole 16 of the activating element lies above the part 4 of the bridge element enabling an upward movement of the part 4. Only the thermally sensitive member 5 counteracts the biasing of part 4 in direction B. The thermal fuse is in the activated state.

FIG. 2.d) shows the activated thermal fuse after the temperature T has raised above $T_L$. The solder forming the thermally sensitive member has melted and the part 4 of the bridge element was displaced into its second position. The coil spring 6 is expanded compared to FIG. 2.c) and holds the part 4 in its second position. The electrical contacts between the bridge element and the first and second terminal and therefore also the electrical contact between the terminals is interrupted.

Figure 3:
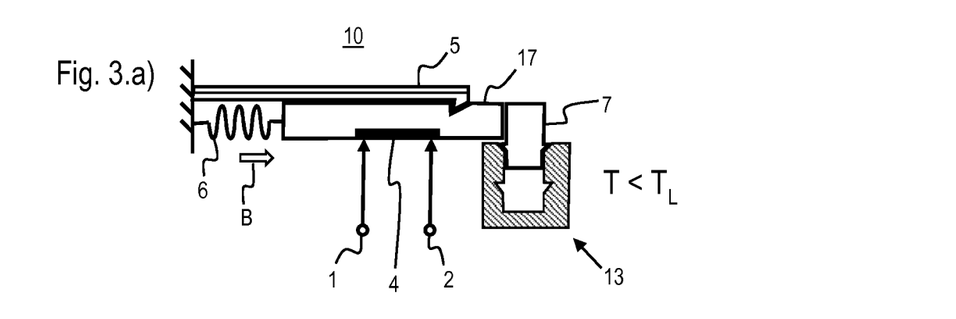

FIG. 3 shows a schematic and simplified view of a further embodiment of the activatable thermal fuse in four different states. In this embodiment the displaceable part 4 of the bridge element is formed as electrically conductive section of a movable block 17 being non-conducting apart from the conductive section. Electrical contact to each of the first 1 and second 2 terminal is established via a sliding contact. In this embodiment the thermally sensitive member 5 is a bimetal strip having an interlocking connection to the movable block 17.

FIG. 3.a) shows the thermal fuse in the disabled state at temperature $T<T_L$. The bimetal strip is straight such that the interlocking connection to the movable block 17 is established and the part 4 is hold in its first position.

FIG. 3.b) shows the thermal fuse in the disabled state at $T>T_L$. The bimetal strip bends upward and the interlocking connection is released. The activating element 7 counteracts the biasing force in direction B of the biasing element 6, which in this embodiment is a compressed coil spring.

FIG. 3.c) shows the thermal fuse in the activated state at temperature $T<T_L$. By applying a force in direction A the activating element 7 was pushed into a bore serving as guiding element. The activating element 7 is now in its second position, such that the displaceability of the movable block 17 and therewith the part 4 is enabled. A snapping mechanism 13 prevents a returning of the activating element from its second position into its first position.

FIG. 3.d) shows the thermal fuse in the activated state at temperature $T>T_L$. The interlocking connection was released due to the upward bending of the bimetal strip acting as thermally sensitive member 5. The part 4 is in its second position. The sliding contact in connection with the first terminal 1 is only in contact with the non-conductive part of the movable block 17 and the electrically connecting path from the first terminal 1 to the second terminal 2 is interrupted.

Figure 4:
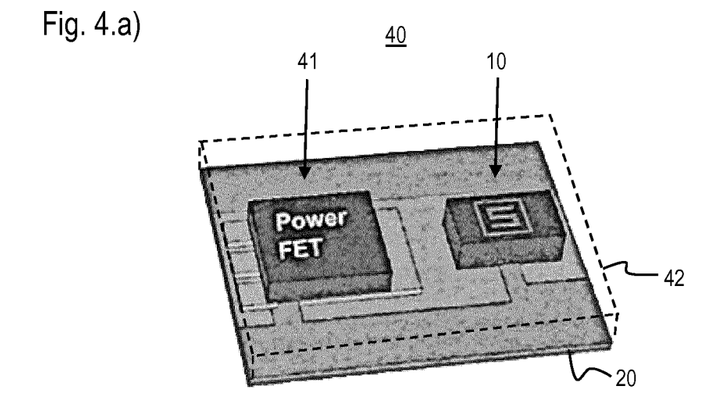

FIG. 4.a) shows an electronical circuit 40 with an activatable thermal fuse according to the present invention. The thermal fuse 10 is mounted in proximity of a high power semiconductor device 41 and is connected in series to a current conducting path of the semiconductor device. The thermal fuse and the semiconductor device are surface mounted to a printed circuit board. The semiconductor device may e.g. be a field effect transistor (FET). The thermal fuse is of the type shown in FIG. 2.a) to 2.d). The thermal fuse is shown in the activated state, corresponding to the cross section shown FIG. 2.c). The activating element is in the second position, which in this embodiment is inside the housing of the activatable thermal fuse and therefore the activating element is not visible. With dashed lines a possible common housing 42 of the thermal fuse and the high power semiconductor device is indicated.

FIG. 4.b) shows the electronical circuit 40 of FIG. 4.a). Surface temperature is indicated by gray levels corresponding to temperature values. The temperature distribution shown is typical for a normal operating condition, in which the thermal fuse is not triggered.

Figure 5:
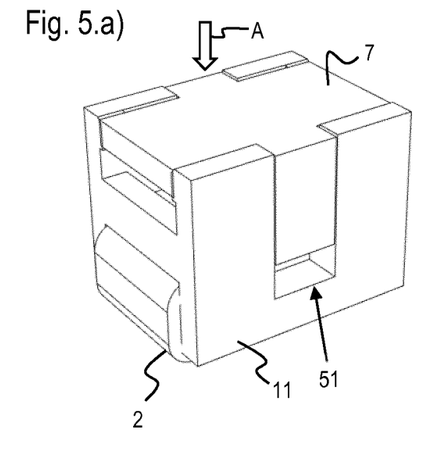
FIG. 5 shows an embodiment of an activatable thermal fuse according to the present invention in three perspective views 5.$a$) to 5.$c$) and a cross-section 5.$d$) through the embodiment.

FIG. 5 shows an embodiment of an activatable thermal fuse according to the present invention in four different views. In every one of these four views the thermal fuse is in the disabled state.

FIG. 5.a) is a perspective view from a viewpoint above the thermal fuse. This embodiment is activated by a force applied from the top side in the direction indicated by the arrow A. A groove 51 in the housing 11 guides the activating element 7 along a linear path of movement.

FIG. 5.b) is a perspective view of the same thermal fuse and from the same viewpoint as FIG. 5.a), but the housing is removed to show the parts inside the housing. The bridge element 4 establishes an electrical contact between the first terminal 1 and the second terminal 2. Thermally sensitive members 5, 5' are formed as thin solder layers at the interfaces between the bridge element 4 and the first and second terminals 1, 2 at the positions indicated by the reference signs.

FIG. 5.c) is a perspective view from a viewpoint below the thermal fuse allowing a direct view onto the first and second terminal 1, 2. The dash-dotted line C indicates the position of the cross-section shown in FIG. 5.d).

FIG. 5.d) is a cross-section through the thermal fuse. The cross-section through the thermal fuse is along a plane that lies in the middle between the first and second terminals 1, 2. A nose 52 formed as part of the activating element 7 holds the bridge element 4 in its position. It further provides a snapping mechanism, similar to a snap-fastener. The activating element 7 can be pushed down into its second position, whereby a mechanical resistance is surmounted and whereby a slight deformation of the activating element 7 occurs. With the activating element 7 being in its second position, the bridge element 4 is not hold in position anymore, as there is enough room above the bridge element for the bridge element to be moved out of its first position by the biasing element 6 once the solder forming the thermally sensitive members 5, 5' melts. The biasing element 6 is built as coil spring. It exerts an upwardly directed force onto the bridge element 4. This force is weaker than the force needed to snap the nose 52 across the bridge element 4. For activation of the thermal fuse according to this embodiment a larger force than this force of the spring has to be applied from the top side of the thermal fuse onto the activating element. The activating element 7 is directly accessible and visible from the top side.

Figure 6:
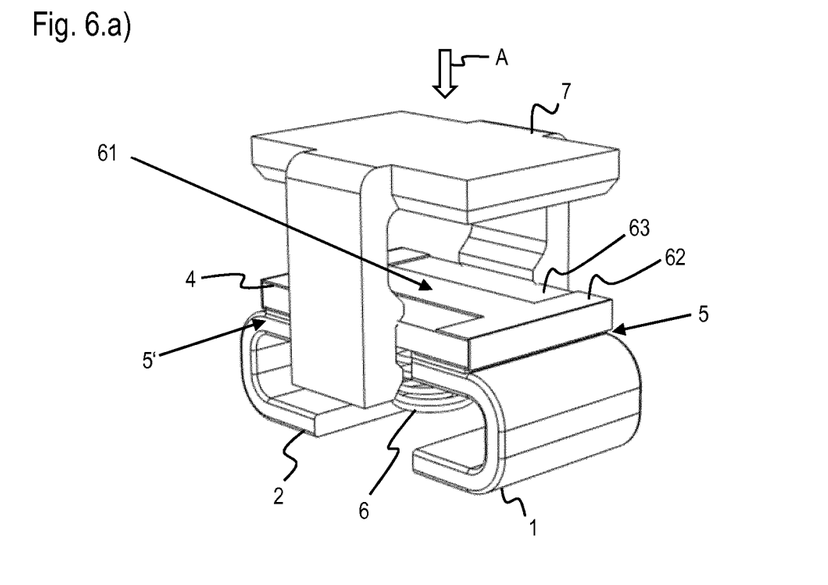
FIG. 6 shows an embodiment of an activatable thermal fuse according to the present invention in a perspective view 6.$a$), wherein the housing is removed and in a perspective cut-away view 6.$b$).

FIG. 6 shows an embodiment of an activatable thermal fuse according to the present invention in two different views FIG. 6.a) and FIG. 6.b). In this embodiment, the bridge element comprises a current-limiting fuse element (61). In both views, the thermal fuse is in the disabled state.

FIG. 6.a) is a perspective view of the activatable thermal fuse with the housing being removed for better visibility of the components in the interior. In the embodiment shown here, the part 4 of the bridge element is constructed as electrically isolating substrate 63 carrying a conducting path 62, which is soldered to the first 1 and second 2 electrical terminals by the thermally sensitive members 5, 5'. A constriction in the conducting path 62 forms a current-limiting fuse element 61. Due to the smaller cross-section in the region of the constriction, the current path melts here, if a current higher than the rated current of the fuse flows through the conducting path. The current-limiting fuse element 61 needs not to be activated. If an activating force is applied onto the activating element 7 in direction of A, the activating element 7 can be moved into the second position of the activation element 7 and thereby enabling an upward displaceability of part 4 of the bridge element. The biasing member 6 in form of a coil spring applies an upward acting biasing force onto the part 4.

FIG. 6.b) is a perspective view of half the activatable thermal fuse, the other half being cut-away. In FIG. 6.b) the housing 11 is present. The cutting plane cuts through the conducting path 62 at a position, where the current-limiting fuse element 61 is formed by a constriction in the conducting path. The thin layer of the conducting path is carried by an electrically isolating substrate 63. In the first position of the activating element 7 shown in this figure, two noses 52 on the activating element 7 block the displaceability of the part 4 of the bridge element with respect to the housing 11. A groove 51 in the housing guides the activating element 7 when the activating element is moved into its second position. The activating element 7 is deformable to a certain degree, such that the upper nose 52 can be pushed over the obstacle formed by part 4 and the adjacent part of the housing 11. The housing 11 holds the biasing member 6 in place.

Figure 7:
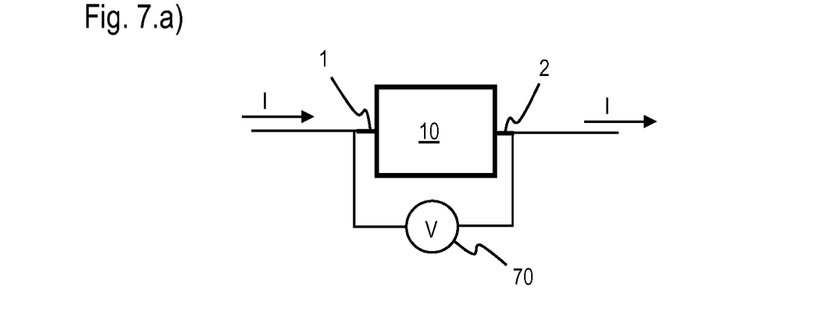
FIG. 7 shows circuit diagrams 7.$a$) to 7.$c$) of three measuring configurations applicable to the method of monitoring the state of an activatable thermal fuse.

FIG. 7.a) to 7.c) show schematic circuit diagrams of measuring configurations comprising an activatable thermal fuse 10 and a voltmeter 70 used to measure a voltage V as applied in the method of monitoring the state the thermal fuse.

FIG. 7.a) shows an activatable thermal fuse 10 with a current I flowing into the first electrical terminal 1 and flowing out of the second electrical terminal 2. When triggered, the activatable thermal fuse 10 interrupts the current I. A voltmeter 70 measures a voltage V between the terminal 1 and terminal 2. With the resistance of the thermal fuse known to have a value R, the current I can be calculated as I=V/R.

FIG. 7.b) shows an activatable thermal fuse 10, which has an additional electrical terminal 71. A voltmeter 70 is arranged to measure the voltage between terminals 2 and 71. This way it is e.g. possible to measure a thermally induced voltage over a thermocouple contact formed along the conducting path of the thermal fuse 10. Another possibility in this measuring configuration is to detect whether the bridge element is still in electrical contact to the terminal 2, i.e. whether the thermal fuse is in a triggered state or not.

FIG. 7.c) shows an activatable thermal fuse 10 having two additional electrical terminals 71, 72. A voltmeter 70 is arranged to measure the voltage between terminals 71 and 72. In this measurement configuration, e.g. a voltage drop over a defined section of the current conducting path of the thermal fuse is possible.

LIST OF REFERENCE SIGNS 1 first terminal
2 second terminal
3 bridge element
4 part of the bridge element
5 thermally sensitive member
5' further thermally sensitive member
6 biasing member
7 activating element
10 activatable thermal fuse
11 housing
12 base plate
13 snapping mechanism
14, 15 leads
16 hole (in the activating element)
17 movable block
20 printed circuit board
21, 22 soldering pads
23 solder
40 electronical circuit with an activatable thermal fuse
41 high power semiconductor device
42 common housing (of 10 and 41)
51 groove (in the housing)
52 nose
61 current-limiting fuse element
62 conducting path
63 electrically isolating substrate
70 voltmeter
71, 72 additional electrical terminals
A direction of activating action
B direction of biasing
I current
T temperature
$T_L$ predetermined temperature value
V voltage

The invention claimed is:

1. An activatable thermal fuse having:
   an enabled state, in which the activatable thermal fuse is configured to be triggered by exceeding a predetermined temperature value, and
   a disabled state, in which the activatable thermal fuse is configured not to be triggered even if said predetermined temperature value is reached or exceeded,
   said activatable thermal fuse further comprising:
   a first electrical terminal and a second electrical terminal,
   an electrically conductive bridge element having a first electric contact with said first electrical terminal and having a second electric contact with said second electrical terminal,
   wherein, in the enabled state, at least a part of said electrically conductive bridge element is displaceable from a first position in which said first electric contact is established to a second position in which said first electric contact is opened,
   a thermally sensitive member holding said part in said first position and releasing said part as soon as said thermally sensitive member is exposed to said determined temperature value,
   a biasing member biasing said part towards said second position, and
   a mechanically displaceable activating element blocking displacement of said part from said first position, in a first position of said mechanically displaceable activating element, and enabling said displacement of said part in a second position of said mechanically displaceable activating element,
   wherein said disabled state is defined by the mechanically displaceable activating element being in its first position,
   wherein said enabled state is defined by the mechanically displaceable activating element being in its second position,
   wherein at least said electrically conductive bridge element comprises an alloy having a temperature coefficient of resistance, and
   wherein the absolute value of said temperature coefficient of resistance is below 500 parts per million per Kelvin at room temperature.

2. The activatable thermal fuse according to claim 1, comprising a guiding element defining a path of movement of said mechanically displaceable activating element, the path of movement including at least one of a translation, a rotation, or a screw movement.

3. The activatable thermal fuse according to claim 1, comprising a snapping mechanism preventing a returning of said mechanically displaceable activating element from the second position of said mechanically displaceable activating element to the first position of said mechanically displaceable activating element.

4. The activatable thermal fuse according to claim 1, wherein the predetermined temperature value is 240° C. or less.

5. The activatable thermal fuse according to claim 4, wherein the predetermined temperature value is in a range of from 150° C. to 240° C., inclusive.

6. The activatable thermal fuse according to claim 1, wherein the thermally sensitive member comprises a solder.

7. The activatable thermal fuse according to claim 1, wherein the thermally sensitive member comprises at least one of a bimetal strip, a bimetal disc, or a shape memory alloy.

8. The activatable thermal fuse according to claim 1, comprising a housing having a bottom side on which said first and second electrical terminals are arranged.

9. The activatable thermal fuse according to claim 8, wherein the mechanically displaceable activating element is integrated into the housing, and arranges as one piece with the housing, and the mechanically displaceable activating element is accessible from a top side and/or from a bottom side and/or from a lateral side of the housing.

10. The activatable thermal fuse according to claim 9, wherein the position of the mechanically displaceable activating element is visible from a top side of the housing.

11. The activatable thermal fuse according to claim 1, wherein said biasing member is a compressed, stretched, bended or twisted elastic element.

12. The activatable thermal fuse according to claim 1, wherein the biasing member comprises a coil spring, a spiral spring or a leaf spring.

13. The activatable thermal fuse according to claim 1, wherein in the second position of said part of the electrically conductive bridge element said first and said second contacts are open, and wherein said electrically conductive bridge element is a substantially rigid element.

14. The activatable thermal fuse according to claim 1, wherein the activatable thermal fuse is adapted to carry electrical current higher than 5 Ampere.

15. The activatable thermal fuse according to claim 14, wherein the activatable thermal fuse is adapted to carry electrical current higher than 30 Ampere and up to 100 Ampere.

16. The activatable thermal fuse according to claim 1, wherein a current-limiting fuse element is arranged in a conducting path between said first and said second electrical terminal.

17. The activatable thermal fuse according to claim 16, wherein said current-limiting fuse element is formed as a constriction in a conducting path of an electrically isolating substrate.

18. The activatable thermal fuse according to claim 1, wherein the activatable thermal fuse includes further electrical terminals in addition to said first and said second electrical terminals.

19. An electronic circuit comprising an activatable thermal fuse according to claim 1, and further comprising a high power semiconductor device, wherein the activatable thermal fuse is connected in series to a current conducting path of the high power semiconductor device.

20. An electronic circuit according to claim 19, wherein the activatable thermal fuse and the high power semiconductor device are arranged in a common housing.

21. An activatable thermal fuse according to claim 1, wherein the activatable thermal fuse has a predetermined resistance of 500 µΩ or 1 mΩ.

22. A method of manufacturing a printed circuit board with an activatable thermal fuse, comprising:
   providing said activatable thermal fuse having an enabled state, in which the activatable thermal fuse is configured to be triggered by exceeding a predetermined temperature value, and
   having a disabled state, in which the activatable thermal fuse is configured not to be triggered even if said predetermined temperature value is reached or exceeded,
   wherein the activatable thermal fuse further comprises:
   a first electrical terminal and a second electrical terminal,
   an electrically conductive bridge element having a first electric contact with said first electrical terminal and having a second electric contact with said second electrical terminal,
   wherein, in the enabled state, at least a part of said electrically conductive bridge element is displaceable from a first position in which said first electric contact is established to a second position in which said first electric contact is opened,
   a thermally sensitive member holding said part in said first position and releasing said part as soon as said thermally sensitive member is exposed to said predetermined temperature value,
   a biasing member biasing said part towards said second position, and
   a mechanically displaceable activating element blocking displacement from said part in said first position, in a first position of said mechanically displaceable activating element, and enabling said displacement of said part in a second position of said mechanically displaceable activating element,
   wherein said disabled state is defined by the mechanically displaceable activating element being in its first position and wherein said enabled state is defined by the mechanically displaceable activating element being in its second position,
   wherein at least said electrically conductive bridge element comprises an alloy having a temperature coefficient of resistance, and
   wherein the absolute value of said temperature coefficient of resistance is below 500 parts per million per Kelvin at room temperature,
   the method further comprising the steps of:
   covering conductive soldering pads of the printed circuit board with a solder,
   positioning the first electrical terminal and the second electrical terminal of the activatable thermal fuse on conductive soldering pads covered with said solder,
   ensuring that the mechanically displaceable activating element of the activatable thermal fuse is in said first position of the mechanically displaceable activating element,
   heating the printed circuit board to a temperature above the melting point of the solder,
   cooling down the printed circuit board below the melting point of the solder, and
   moving the mechanically displaceable activating element of the thermal fuse into the second position of the mechanically displaceable activation element.

23. A method according to claim 22, wherein said activatable thermal fuse has a predetermined resistance of 500 µΩ or 1 mΩ.

24. A method of monitoring the state of an activatable thermal fuse comprising:
   providing said activatable thermal fuse having an enabled state, in which the activatable thermal fuse is configured to be triggered by exceeding a predetermined temperature value, and
   having a disabled state, in which the activatable thermal fuse is configured not to be triggered even if said predetermined temperature value is reached or exceeded,
   wherein the activatable thermal fuse further comprises:
   a first electrical terminal and a second electrical terminal,
   an electrically conductive bridge element having a first electric contact with said first electrical terminal and having a second electric contact with said second electrical terminal,
   wherein, in the enabled state, at least a part of said electrically conductive bridge element is displaceable from a first position in which said first electric contact is established to a second position in which said first electric contact is opened,
   a thermally sensitive member holding said part in said first position and releasing said part as soon as said thermally sensitive member is exposed to said predetermined temperature value,
   a biasing member biasing said part towards said second position, and
   a mechanically displaceable activating element blocking displacement from said part in said first position, in a first position of said mechanically displaceable activating element, and enabling said displacement of said part in a second position of said mechanically displaceable activating element,
   wherein said disabled state is defined by the mechanically displaceable activating element being in its first position and wherein said enabled state is defined by the mechanically displaceable activating element being in its second position,
   wherein at least said electrically conductive bridge element comprises an alloy having a temperature coefficient of resistance, and
   wherein the absolute value of said temperature coefficient of resistance is below 500 parts per million per Kelvin at room temperature,
   the method further comprising:

measuring a voltage between the first electrical terminal and the second electrical terminal of said activatable thermal fuse determining at least one of a triggering state, a current or a temperature of the activatable thermal fuse in response to the measuring of the voltage.

25. A method according to claim 24, comprising:

measuring the voltage between said first electrical terminal and said second electrical terminal, and determining a current flowing through the activatable thermal fuse based on the measured voltage and a predetermined resistance value of the activatable thermal fuse.

26. A method according to claim 25, wherein the predetermined resistance value is 500 µΩ or 1 mΩ.

27. A method according to claim 24, wherein said activatable thermal fuse has a predetermined resistance of 500 µΩ or 1 mΩ.

* * * * *

UNITED STATES PATENT AND TRADEMARK OFFICE
CERTIFICATE OF CORRECTION

PATENT NO. : 10,784,065 B2
APPLICATION NO. : 16/069097
DATED : September 22, 2020
INVENTOR(S) : Guido Signer et al.

Page 1 of 1

It is certified that error appears in the above-identified patent and that said Letters Patent is hereby corrected as shown below:

On the Title Page

Item (30) Under Foreign Application Priority Data section, "(WO)" should read -- (EP) --.

In the Claims

Column 13, Claim 1, Lines 58-59, "determined" should read -- predetermined --.

Signed and Sealed this
Twenty-fourth Day of November, 2020

Andrei Iancu
*Director of the United States Patent and Trademark Office*